United States Patent
Li et al.

(10) Patent No.: US 10,903,117 B2
(45) Date of Patent: Jan. 26, 2021

(54) FABRICATING VIAS WITH LOWER RESISTANCE

(71) Applicant: International Business Machines Corporation, Armonk, NY (US)

(72) Inventors: Baozhen Li, South Burlington, VT (US); Chih-Chao Yang, Glenmont, NY (US); Andrew Tae Kim, Orangevale, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/291,463

(22) Filed: Mar. 4, 2019

(65) Prior Publication Data
US 2020/0286780 A1     Sep. 10, 2020

(51) Int. Cl.
*H01L 21/768* (2006.01)
*H01L 23/532* (2006.01)
*H01L 21/3213* (2006.01)
*H01L 23/522* (2006.01)
*H01L 23/528* (2006.01)

(52) U.S. Cl.
CPC .. *H01L 21/76892* (2013.01); *H01L 21/32133* (2013.01); *H01L 21/32139* (2013.01); *H01L 21/76805* (2013.01); *H01L 21/76843* (2013.01); *H01L 21/76877* (2013.01); *H01L 23/5226* (2013.01); *H01L 23/5283* (2013.01); *H01L 23/53238* (2013.01)

(58) Field of Classification Search
None
See application file for complete search history.

(56) References Cited

U.S. PATENT DOCUMENTS

| | | | |
|---|---|---|---|
| 5,863,835 A | 1/1999 | Yoo | |
| 7,781,892 B2 | 8/2010 | Chen | |
| 8,232,196 B2 | 7/2012 | Yang | |
| 9,337,195 B2 | 5/2016 | Lin | |
| 2007/0082488 A1* | 4/2007 | Katou | H01L 21/76867 438/687 |
| 2007/0155152 A1* | 7/2007 | Kang, II | H01L 23/53238 438/597 |
| 2008/0012142 A1* | 1/2008 | Mehta | H01L 23/5226 257/762 |
| 2011/0100697 A1* | 5/2011 | Yang | H01L 21/76808 174/262 |

(Continued)

FOREIGN PATENT DOCUMENTS

JP     2016111047 A     6/2016

OTHER PUBLICATIONS

"Method of Etching Cu in High Aspect Ratio Geometry", Disclosed Anonymously, IPCOM000245402D Mar. 7, 2016.

*Primary Examiner* — Long Pham
(74) *Attorney, Agent, or Firm* — Jeffrey S LaBaw; Steven J Meyers

(57) ABSTRACT

An interconnection for a device in an integrated circuit includes a substrate on which a first metal line is embedded in a first dielectric layer. A via gouge is etched in the first metal line. A second dielectric layer is deposited over the first metal line and the first dielectric layer. A first via recess is etch through the second dielectric layer where the first via recess aligned to the via gouge. A second metal layer is deposited in the first via recess and the via gouge, forming a first via.

8 Claims, 13 Drawing Sheets

(56) References Cited

U.S. PATENT DOCUMENTS

2016/0163587 A1      6/2016  Backes
2017/0263557 A1      9/2017  Clevenger
2018/0033683 A1*     2/2018  Murray ............. H01L 21/76816
2018/0204800 A1*     7/2018  Adusumilli ......... H01L 23/5283

* cited by examiner

FABRICATING VIAS WITH LOWER RESISTANCE

BACKGROUND OF THE INVENTION

This disclosure relates to integrated circuit devices. More specifically, it relates to a method and structure to create interconnect structures in semiconductor devices with vias with lower, improved resistance.

As the dimensions of modern integrated circuitry in semiconductor chips continue to shrink, conventional semiconductor manufacturing technologies are increasingly challenged to make smaller and smaller structures.

In semiconductor devices, circuits which form an integrated circuit are fabricated on a semiconductor substrate. It is typical to have a set of interconnect layers which interconnect the devices which are built in the semiconductor substrate. In conventional interconnects, "via" layers alternate with metal line layers. The via layers are comprised of short, vertical (perpendicular with respect to the substrate surface), cylindrical metal elements which interconnect the metal line layers which largely comprise long lines of metal or other conductor which run parallel to the semiconductor substrate in which the devices are fabricated. Both the metal lines and the vias are built in inter-layer dielectric (ILD) layers. An interconnect structure may consist of multilevel or multilayered schemes, such as, for example, single or dual damascene wiring structures.

The quality of the metal lines and metal vias is important to ensure good yield and reliability of the integrated circuit. One of the problems which has been identified is that the via to metal line interconnections have too much resistance at small geometries. Another problem is the poor mechanical strength of deep submicron metal contacts between the metal lines and vias, which can cause thermal cycling and/or stress migration failures in the interconnect structures. To solve these problems a so-called "via gouging feature", or more simply a "via gouge", is created which "anchors" the vias to the metal lines area. The via gouge has been widely adopted by the semiconductor industry for both increased mechanical strength and improved electrical contact resistance.

However, at ever smaller geometries, the traditional via gouging process can produce a mushroom-like shape at the bottom of the via. The edges of the mushroom do not receive some of the processing resulting in poor liner coverage and metal fill causing reliability and resistance problems.

Thus, it is desirable to provide processes which can be used to make improved interconnect structures for integrated circuitry using improved via to metal line connections.

BRIEF SUMMARY

According to this disclosure, an interconnection for a device in an integrated circuit includes a substrate on which a first metal line is embedded in a first dielectric layer. A via gouge is etched in the first metal line. A second dielectric layer is deposited over the first metal line and the first dielectric layer. A first via recess is etch through the second dielectric layer where the first via recess aligned to the via gouge. A second metal layer is deposited in the first via recess and the via gouge, forming a first via.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

Figure 1:
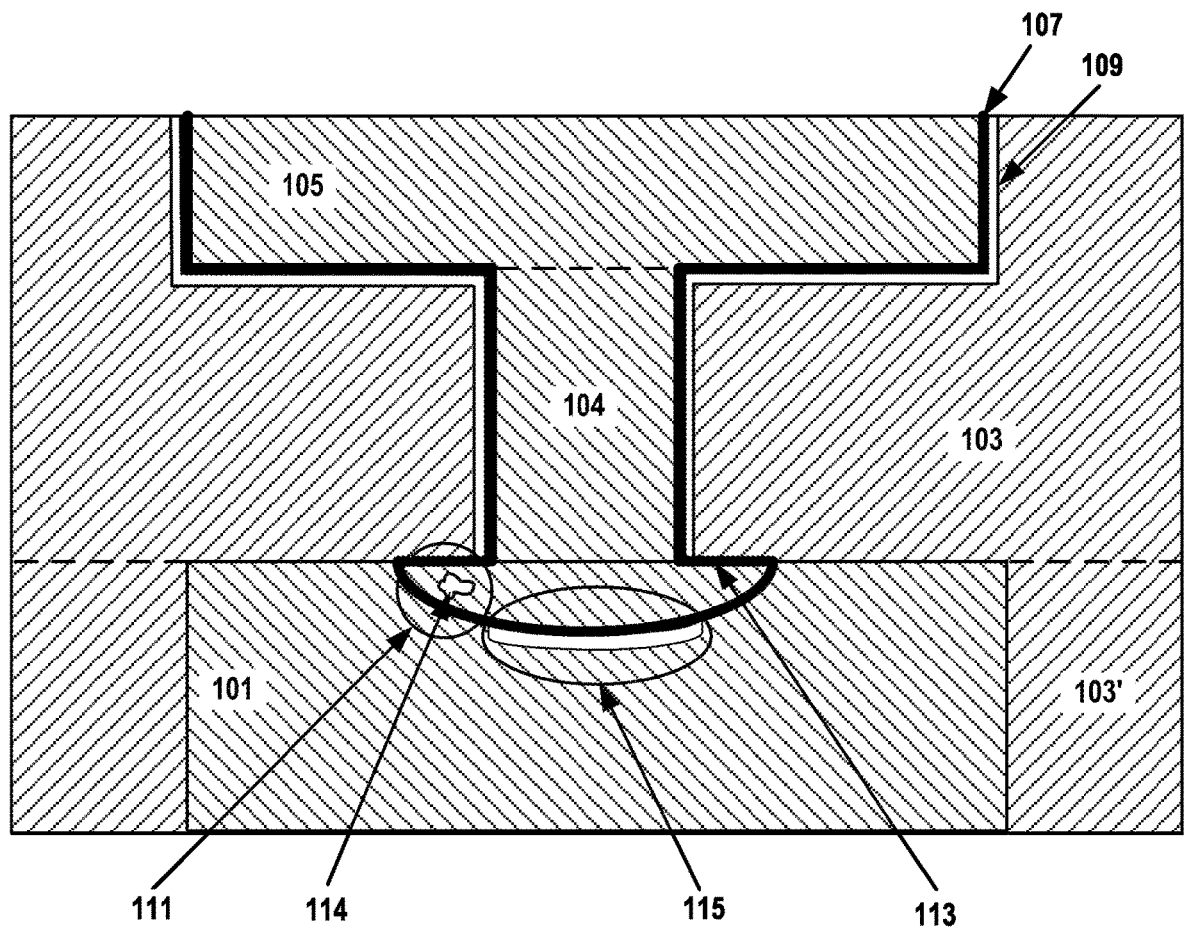
FIG. 1 is a cross-sectional diagram of a prior art structure illustrating the problems solved by the invention.

At a high level, the invention includes processes which allow via to metal line interconnect structures to be more controllably fabricated by etching the via gouge in the metal line prior to depositing dielectric and fabricating the overlying metal, i.e. making the via gouge before etching the via recess in the dielectric. In embodiments of the invention, the same mask used for patterning the via in the dielectric is used for making the pre-dielectric via gouge. While the invention requires more steps than the prior art process, the overall process has a much greater process window and the chips fabricated using the process have greater reliability.

When a process for 7 nm features (and beyond) using via gouging to reduce the via resistance was being developed, it was difficult to attain the desired via profile. In the prior art via gouging process, the via or metal/via recess is first etched in the dielectric to the top of the metal line. Then, the underlying metal is etched (or in other processes, oxidized and then etched) to achieve a bowl-like "via gouge" in the underlying metal. In small geometries, the process is difficult to control, and frequently resulted in a mushroom-shaped via shape, the edges of which would not receive the full processing and desired layers.

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures, etc. The substrate can also comprise dielectric materials as described below. Further, active devices may be embedded in the substrate.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein, unless specified, can, for example, be grown from either a dry oxygen ambient or steam and then patterned. Alternatively, the dielectrics herein may be formed from any of the many candidate high dielectric constant (high-k) materials, including but not limited to hafnium oxide, aluminum oxide, silicon nitride, silicon oxynitride, a gate dielectric stack of SiO2 and Si3N4, and metal oxides like tantalum oxide that have relative dielectric constants above that of SiO2 (above 3.9). The dielectric can be a combination of two or more of these materials. The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as a sidewall structure. The sidewall structures can be used as masking structures for further semiconducting processing steps.

Embodiments will be explained below with reference to the accompanying drawings.

FIG. 1 is a cross-sectional diagram of a prior art structure illustrating the problems solved by the invention. In the prior art process, a first level of metal is formed in a first dielectric layer 103' which covered by a second layer of dielectric 103 in which a recess is etched for a via 104 and second level metal layer 105. As was mentioned above, the inventors were developing a process for 7 nm features and beyond to significantly reduce the via resistance by using via gouging and UV nitridation. However, instead of a bowl-like gouge which extended just to the vertical sides of the via 104 as desired (see the desired profile in FIG. 7), the edges 111, 113 of the bowl-like via gouge often extended under the edges of the top dielectric 103 as shown in the drawing. Only a central region 115 of the via gouge would receive the barrier layer 109, so the copper or other metallurgy will react with or diffuse into the dielectric. Small voids 114 could also occur in the "shadow" of the dielectric 103.

This "mushroom-like" profile for the via 104 is undesirable for additional reasons. It is bad for reliability as it causes both electromigration (EM) and stress migration (SM). Electromigration is metal migration due to electron flow which forms voids in the metal line or via interconnect, thus forming shorts in the interconnection. Stress migration is metal migration due to mechanical stress gradients which forms voids in the metal lines or via. The edges 111, 113 shown in FIG. 1 are "weak spots" where early EM/SM fails occur. One process for creating the via gouge is to oxidize a portion of the underlying copper in the metal line and then remove the oxidized copper. This process can cause capacitance increases when ultra-low K (ULK) dielectrics are used as the insulator. ULK dielectrics are more sensitive to capacitance depletion due to surface damage as well as capacitance increase due to surface oxidation. The edges of the mushroom do not receive the UV processing which provides a nitridized barrier layer due to the "dead corners" under the cap layer, i.e. from a "shadowing effect" of the corners.

A cap layer (not shown) is used in some prior art structures to separate the first and second layers of dielectric 103', 103 and the first layer of metal 101.

Developing the via gouging process to achieve the desired profile was challenging. The inventors discovered that rather than performing the gouging process after via RIE when the via in the overlying dielectric is defined, that is, like the prior art, the via gouge should be defined in the metal line below before the line is capped and covered with the next level of dielectric. Although changing the prior art process in this manner requires extra mask and process steps, it has a much wider process window to allow better control of the via gouge recess. As will be shown, the process also alleviates the problems incurred with the undercut under the cap during via gouging. It avoids the via/line sidewall ILD oxidation which causes a capacitance increase in the interconnect.

Figure 2:
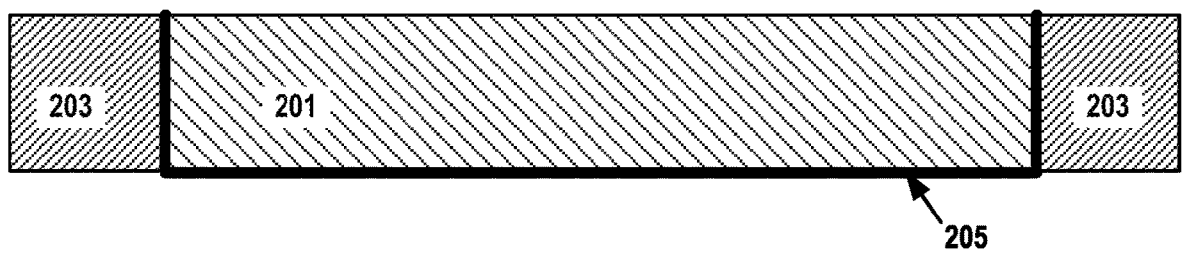
FIG. 2 is a cross-sectional diagram of a starting structure illustrating a metal line in a dielectric in a first embodiment of the invention.

FIG. 2 is a cross-sectional diagram of a starting structure illustrating a metal line in a dielectric in a first embodiment of the invention. The drawing shows the structure after dielectric 203 deposition on a substrate (not shown), patterning of the dielectric 203, etch of a recess for the metal line layer 201, barrier layer 205 deposition, metal layer 201 deposition and planarization steps are performed. These steps are largely conventional to this point. The metal line layer 201 is shown embedded in a first insulator, e.g., a dielectric, layer 203. When a conductor such as copper is used for the metal line layer 201 which can diffuse into a dielectric 203 and cause reliability problems, a barrier layer 205 is used. In this embodiment of the invention, a pattern of recesses is etched through the first dielectric layer 203 to form the metal line pattern. The substrate and possibly other Cu/dielectric layers below 203 and 201 are not shown in FIG. 2 for simplicity.

The metal line layer 201 in preferred embodiments is copper. In alternative embodiments, other metals such as Al, Al(Cu), Co, Ru, Ni, Ir, Rh and W are used. In preferred embodiments, a seed layer, e.g., a copper seed layer is deposited prior to the bulk deposition of the conductor. Conventional deposition processes such as atomic layer deposition (ALD), chemical vapor deposition (CVD), plasma enhanced chemical vapor deposition (PECVD), electroless plating are used to deposit the metals or alloys in respective embodiments. The metal line layer 201 has the thickness of the recess etched in the dielectric layer 203 minus whatever thickness is taken by the barrier layer 205. In this drawing, the metal line and dielectric layers are substantially equal in thickness. In some preferred embodiments, the preferred metal is copper (Cu) and the ranges of thickness for the metal line layer 201 and dielectric layer 203 are preferably 30 nm to 200 nm, but in other embodiments of the invention a thickness in the range of 30 nm to 800 nm.

The first layer of dielectric material 203 can be formed utilizing a conventional deposition process such as, for example, CVD, PECVD, and spin-on coating. The thickness of the blanket layer of dielectric material may vary depending on the technique used to form the same as well as the material make-up of the layer. In a preferred embodiment, the dielectric layer is a low-K dielectric (such as $SiC_xO_yH_z$) layer deposited by conventional processing. Other embodiments use other dielectric materials known to the art.

In some embodiments, an additional layer such a barrier layers 205 or multiple barrier layers of metal are used in embodiments of the invention to prevent diffusion of the conductor metal into the dielectric. Typically, the barrier layer 205 has a thickness from 1 nm to 20 nm, with a thickness from 2 nm to 10 nm being more typical. Suitable liner materials include Ta, Ti, W, Co, Ru, and their nitride materials, TaN, TiN, WN, CoN, RuN and a combination thereof. Conventional deposition processes such as atomic layer deposition (ALD), chemical vapor deposition (CVD), plasma enhanced chemical vapor deposition (PECVD) are used to deposit the barrier layers in respective embodiments. In preferred embodiments, the barrier layer material is TiN.

After deposition of the barrier layer 205 and the metal line layer 203, a chemical mechanical polishing (CMP) step is performed in embodiments of the invention. A CMP step is performed to remove the metal 201 and barrier layer 205 from the top of the field areas of the dielectric 203. A chemical mechanical polishing (CMP) step is a widely used planarization process which is used in embodiments of the invention. Typically, a CMP process uses an abrasive and corrosive chemical slurry (commonly a colloid) in conjunction with a polishing pad. The pad and wafer are pressed together by a dynamic polishing head and held in place by a plastic retaining ring. Other planarization processes are known to the art and are used in alternative embodiments of the invention.

Figure 3:
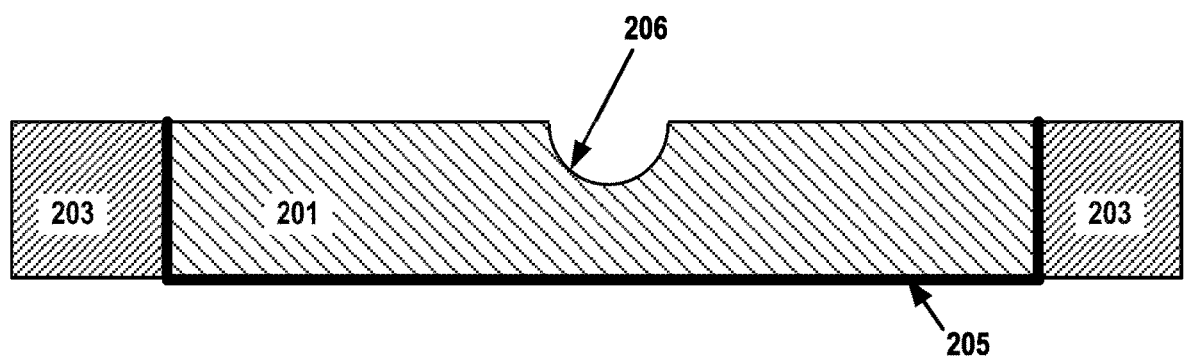
FIG. 3 is a cross-sectional diagram of an etched metal line structure including a via gouge in a first embodiment of the invention.

FIG. 3 is a cross-sectional diagram of an etched metal line structure including a via gouge in a first embodiment of the invention. The via gouge 206 is created by patterning a hard mask (not shown) over the dielectric 203. In some embodiments, the via gouge mask is the same mask used for creating the via in subsequent steps. In other embodiments, different masks are used for each step. After etching the via gouge 206, the hard mask is stripped away leaving the structure as shown in the drawing. More details on alternative processes for creating the via gouge 206 are described below in connection with FIGS. 12 and 13.

Figure 4:
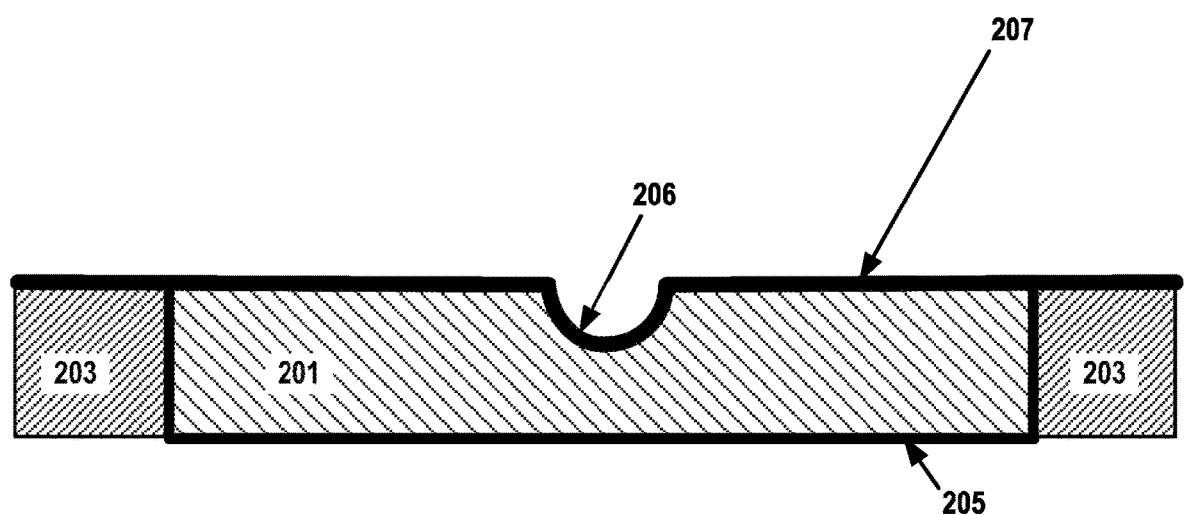
FIG. 4 is a cross-sectional diagram of a capping layer deposited on the etched metal line in a first embodiment of the invention.

FIG. 4 is a cross-sectional diagram of a capping layer deposited on the etched metal line in a first embodiment of the invention. The capping layer 207 is deposited over the metal line 201 and dielectric 203 areas as shown in the drawing. In particular, the capping layer 207 covers the via gouge 206. The capping layer 207 is typically a dielectric and formed by a conventional deposition process such as, for example, CVD, PECVD, chemical solution deposition, or evaporation. Suitable materials for the dielectric capping layer 207 include, but are not limited to, AlN, SiC, Si4NH3, SiO2, a carbon doped oxide, a nitrogen and hydrogen doped silicon carbide (SiC (N,H)), or multilayers thereof. The thickness of the capping layer 207 may vary depending on the deposition process as well as the capping material used. In embodiments of the invention, the dielectric capping layer 207 has a thickness from about 10 nm to about 55 nm, with a thickness within the range from about 15 nm to about 45 nm being more preferred.

Figure 5:
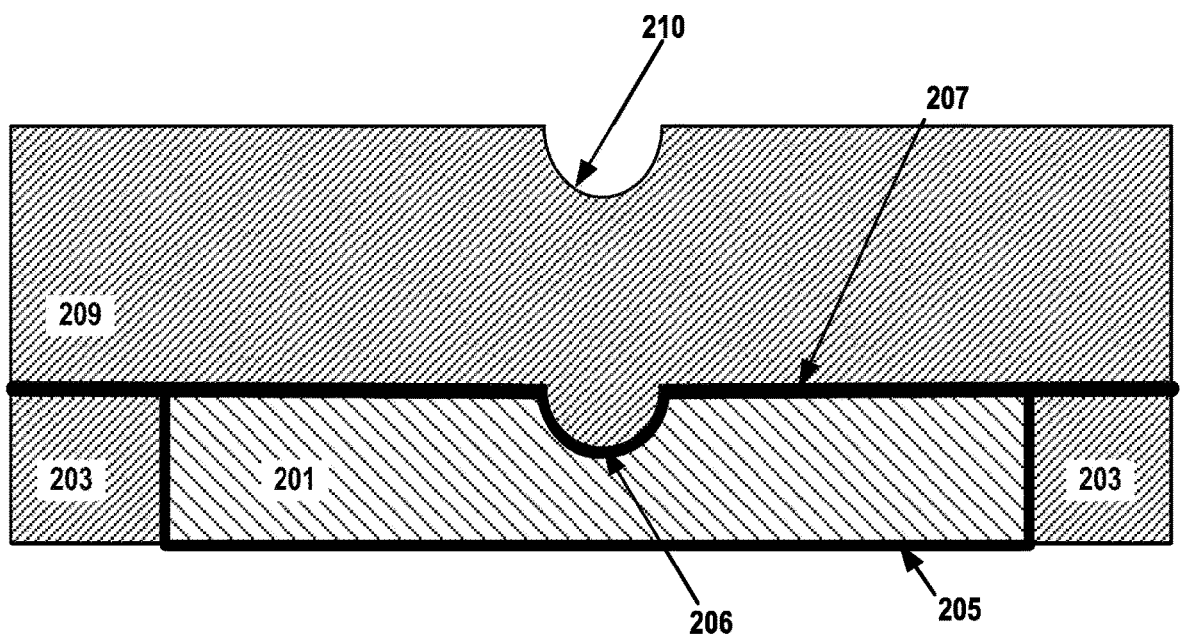
FIG. 5 is a cross-sectional diagram of a dielectric layer deposited on the capping layer in a first embodiment of the invention.

FIG. 5 is a cross-sectional diagram of a second dielectric layer deposited on the capping layer in a first embodiment of the invention. The second dielectric layer 209 may be the same or a different dielectric material as that of the first dielectric layer 203. Typically, the second dielectric layer 209 is the same dielectric material as that of the first dielectric layer 203. In some embodiments, two different dielectric materials are used. The processes and thicknesses used for producing the second dielectric 209 are similar to those used for the first layer 203, but tend to be thicker as both the via and second metal line layers are formed in the second dielectric layer 209. The drawing shows the dielectric layer 209 as being conformal, as the via gouge 206 is replicated in the surface of the second dielectric 209 as indention 210. However, as this is where the recess for the second line metal and via will be formed, this is not a requirement of the invention.

Figure 6:
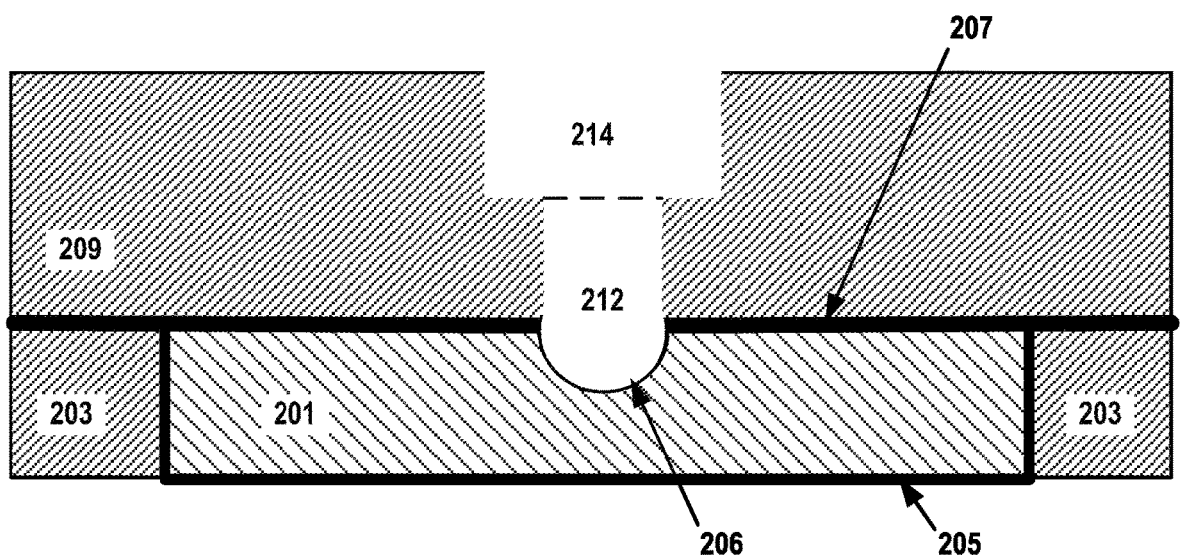
FIG. 6 is a cross-sectional diagram of the via and second level metal recess etched in the dielectric over the via gouge in the first metal line in a first embodiment of the invention.

FIG. 6 is a cross-sectional diagram of the via and second level metal recess etched in the dielectric over the via gouge in the first metal line in a first embodiment of the invention. At least one via opening 212 and a metal line pattern 214 are formed in the second dielectric layer 209. These steps are performed by conventional techniques. That is, first a patterned hard mask (not shown) is formed on top of the upper surface of the second dielectric layer 209 in the via pattern. As was mentioned above, in preferred embodiments, this is the same mask used for forming the via gouge 206. The materials for the hard mask include oxides, nitrides, oxynitrides or metals. The hard mask is formed using a CVD deposition technique; in other embodiments PECVD, chemical solution deposition or evaporation techniques are used. Then, the hard mask is patterned using a lithography technique. Once the via holes are etched, the hard mask, lithography and etch steps are repeated for the metal line pattern. While the via recess 212 has a substantially similar depth dimension as the width dimension shown in the cross section, the conductive line recess 214 is characterized by a long trench having a relatively greater depth dimension (the dimension into the paper) than the width dimension shown in the drawing. After both trench and via etches, then the cap layer at the via recess is opened to expose the Cu 201 below by dry or wet etch.

Though the above example is described using a so-called "via first" process in that the via recess is formed first, a "trench first" process will work as well. This type of recess 212, 214 is sometimes called a double Damascene recess. In other embodiments of the invention, a single Damascene process is used to make the via recess through the entire second dielectric layer 209. That is, in the single Damascene embodiment, only via recesses and not metal recesses are etched. In yet other embodiments, portions of the chip will have a metal pattern while others will only have vias.

Figure 7:
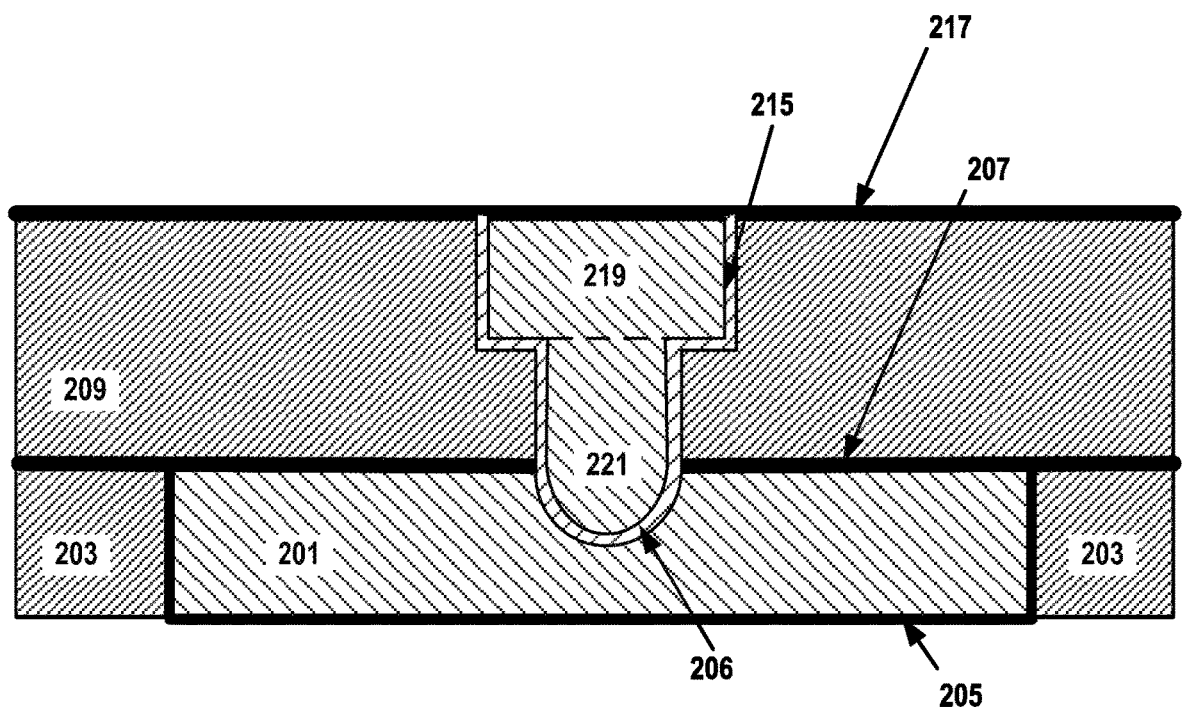
FIG. 7 is a cross-sectional diagram of the via and second level metal recess filled with a barrier layer and a metal layer in a first embodiment of the invention after a chemical mechanical polishing (CMP) step has been performed.

FIG. 7 is a cross-sectional diagram of the via and second level metal recess filled with a barrier layer and a metal layer in a first embodiment of the invention after chemical mechanical polishing (CMP) and capping layer steps have been performed. In preferred embodiments, the materials and processes are similar to those used in forming the first layer. That is, barrier layer 215 is formed using the same barrier layer material as barrier layer 205 and then the metal chosen as the second metal line 219 and via 221 (shown as a monolithic cross-section) is the same as the metal used in first level metal 201.

The excess metal and barrier layer materials are then planarized from the field areas of the dielectric 209. For example, a CMP process can be used as the planarization process. Next, the top surface is capped by the capping layer 217. While barrier layer 215 is shown in a different manner than barrier layer 205 to show the barrier layer 215-capping layer 207 interface, they are typically the same material from layer to layer. However, in other embodiments, the materials can be different in the two layers.

Because the via gouge 206 was formed prior to the deposition of the capping layer 207 and the second dielectric 209, the via gouge 206 has the desired shape and lateral size. It is preferred that the extent, or width, of the via gouge is substantially the same as the via walls. Although the inventive process needs extra mask and process steps as compared to the conventional process, it should have much wider process window and allows easier control of the recess. There is no concern about the undercut under the capping layer 207 during via gouging. Without the undercut, the process avoids the via/line sidewall inter-layer dielectric (ILD) oxidation causing capacitance increases and prevents the voids forming at the via/cap corners.

Figure 8:
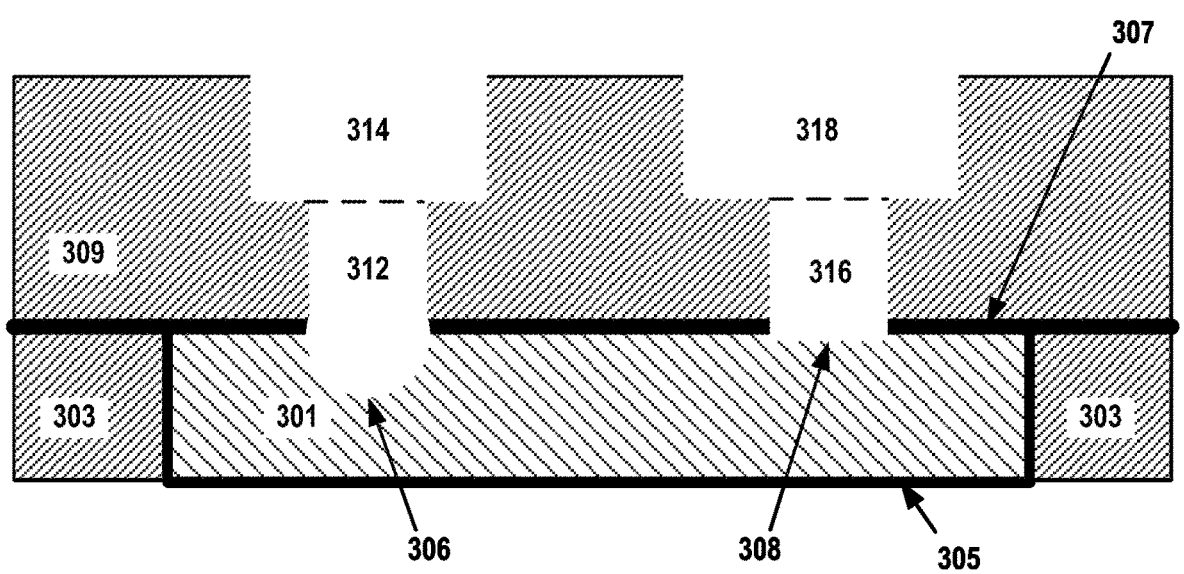
FIG. 8 is a cross-sectional diagram of a first via and second level metal recess etched in the dielectric over the via gouge in the first metal line and a second via and second level metal recess etched in the dielectric over the via gouge in the first metal line in a second embodiment of the invention.

FIG. 8 is a cross-sectional diagram of a first via and second level metal recess etched in the dielectric over the via gouge in the first metal line and a second via and second level metal recess etched in the dielectric over the first metal line in a second embodiment of the invention. In this embodiment, the processing steps are similar to that of the first embodiment, however, the masks used for the via gouge layer and the via layer are different. In this embodiment, the via gouges 306 are only created in the critical areas in which low resistance is required; in other areas, the flat, "regular" via bottom 308 is created. As shown, via opening 312 and a metal line pattern 314 are formed in the second dielectric layer 309 over via gouge 306 in a critical area, while via opening 316 and metal line pattern 318 are formed in a non-critical area. In this embodiment, the mask used for via gouges shares the via positions in the critical areas of the via mask, but lacks the via positions in the non-critical areas.

Figure 9:
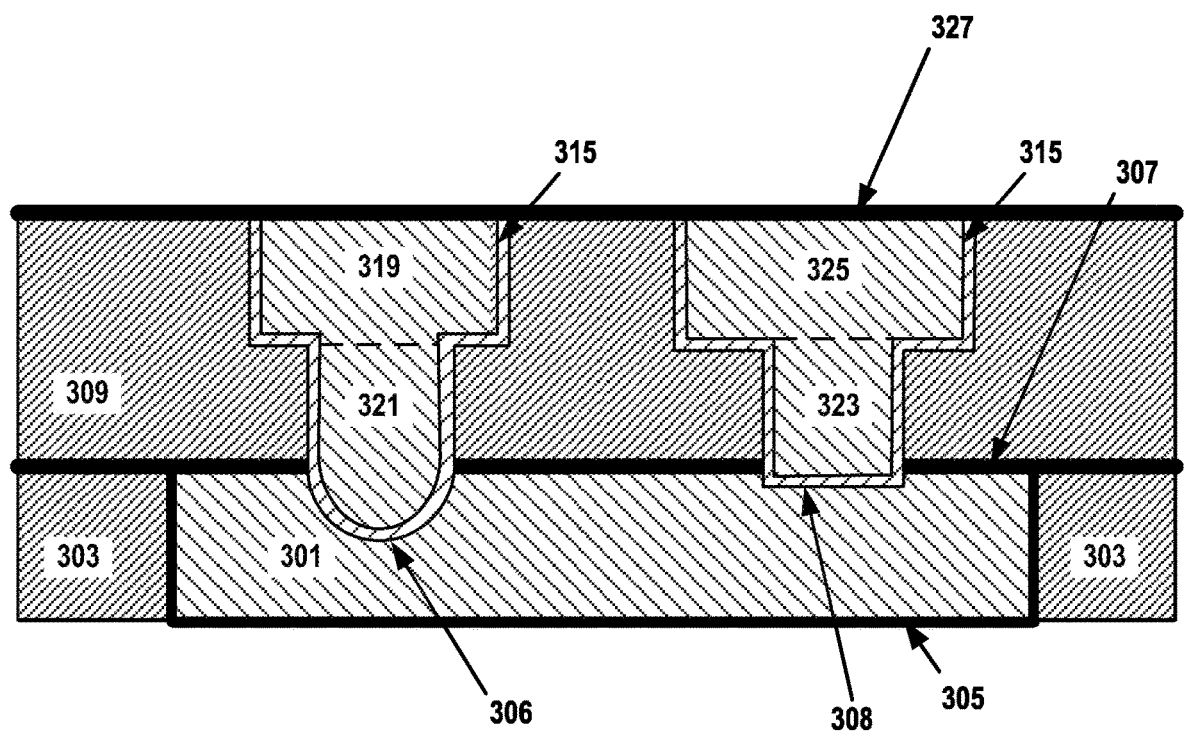
FIG. 9 is a cross-sectional diagram of the first and second via and second level metal line recess filled with a barrier layer and a metal layer in a second embodiment of the invention after a CMP step has been performed.

FIG. 9 is a cross-sectional diagram of the first and second via and second level metal line recess filled with a barrier layer and a metal layer in a second embodiment of the invention after a CMP step and capping layer step have been performed. Barrier layer 315 is formed and then the metal chosen as the second metal line and via is deposited. The excess metal and barrier layer materials are then planarized from the field areas of the dielectric 309 and the top surface is capped by the capping layer 327. As shown in the drawing, while the metal lines 319 and 325 in the critical and non-critical areas have similar cross-sections, the vias 321 in the critical areas have the via gouge 306, but the regular vias 323 in the non-critical areas 323 do not.

Figure 10:
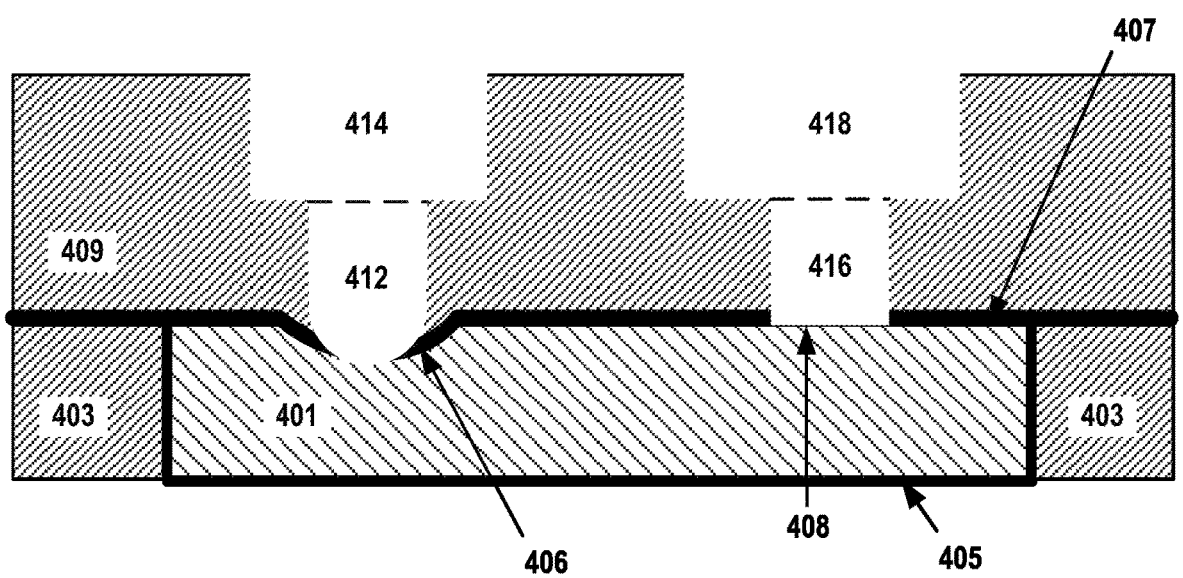
FIG. 10 is a cross-sectional diagram of the via and second level metal recess etched in the dielectric over the via gouge in the first metal line in a third embodiment of the invention.

FIG. 10 is a cross-sectional diagram of the via and second level metal recess etched in the dielectric over the via gouge in the first metal line in a third embodiment of the invention. In this embodiment, the via gouge 406 is larger in width than the width of the via recess 412. This embodiment is shown to illustrate the greater process window of the present invention over the prior art. If the width of the via gouge 406, either by design or by accident, exceeds the width of the via recess 412, no undercut is produced. The via wall will extend straight down to the curved surface of the via gouge 406. This is because the process requires only the regular via etch and cap opening, there is no need to continue etching the metal to make the via gouge, as the via gouge 406 is already present. Since the total etch is shortened, the possibility of the undercut is greatly reduced.

Figure 11:
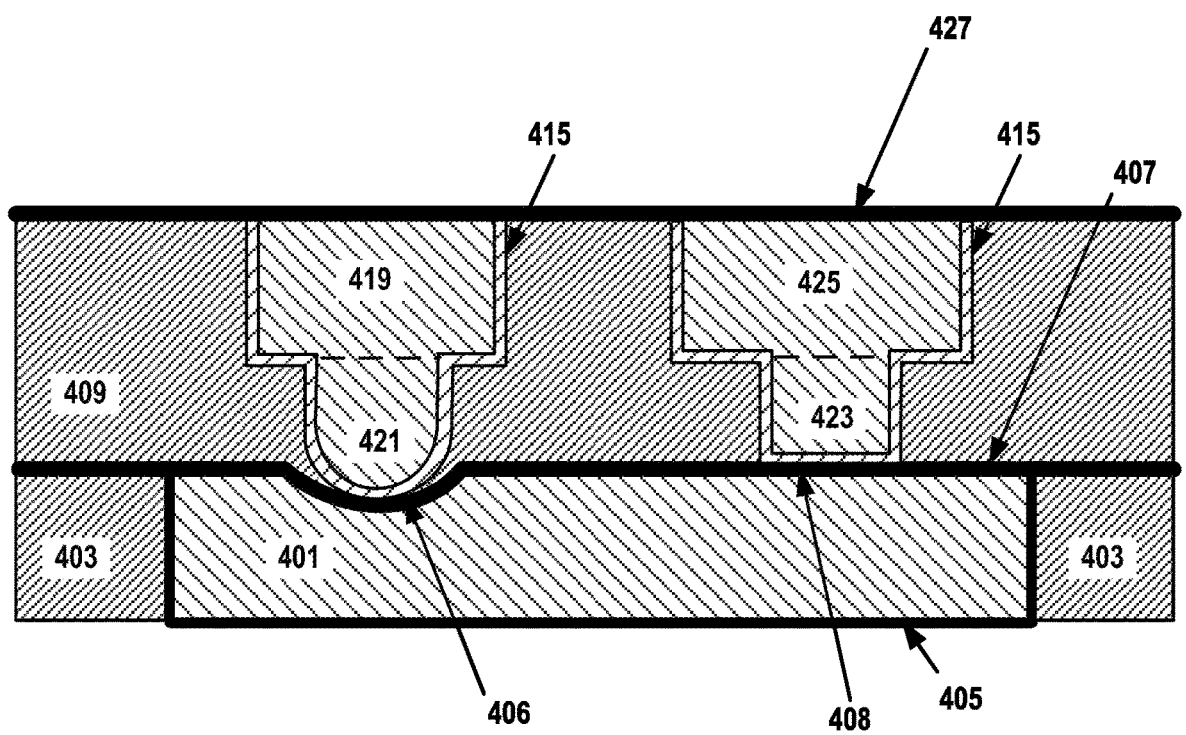
FIG. 11 is a cross-sectional diagram of the via and second level metal recess filled with a barrier layer and a metal layer in a third embodiment of the invention after a chemical mechanical polishing (CMP) step has been performed.

FIG. 11 is a cross-sectional diagram of the via and second level metal recess filled with a barrier layer and a metal layer in a third embodiment of the invention after a chemical mechanical polishing (CMP) step has been performed. The barrier layer 415 is formed. Then, the metal for second metal line patterns 419, 425 and vias 421, 423 is deposited. The excess metal and barrier layer material are then planarized from the field areas of the dielectric 409 and the top surface is capped by the capping layer 427. As shown in the drawing, the metal lines 419 and the vias 421 in the critical areas have the via gouge 406, but the metal lines 425 and the regular vias 423 in the non-critical areas do not.

Instead of an undercut, the entire straight wall of the via is covered by the barrier layer 415. Because of the presence of the barrier layer 415 at the bottom of the via 421, the ILD oxidation and consequent capacitance increase of the prior art is avoided. As shown, the bottom of the via gouge 406 is covered by the barrier layer 415 at a central portion of the gouge 406 and by the capping layer 407 at a peripheral portion. The boundary between the central portion and the peripheral portion is at the via wall. With the intersection of the barrier layer and the capping layer, the voids as depicted in FIG. 1 under the cap are prevented.

In the drawing, the vias 421 in critical areas are shaped differently from the vias 423 in non-critical areas. The vias in non-critical areas can have the normal, flat bottoms which terminate at the top of the underlying metal layer. However, in other embodiments, all the vias are produced with via gouges.

Figure 12:
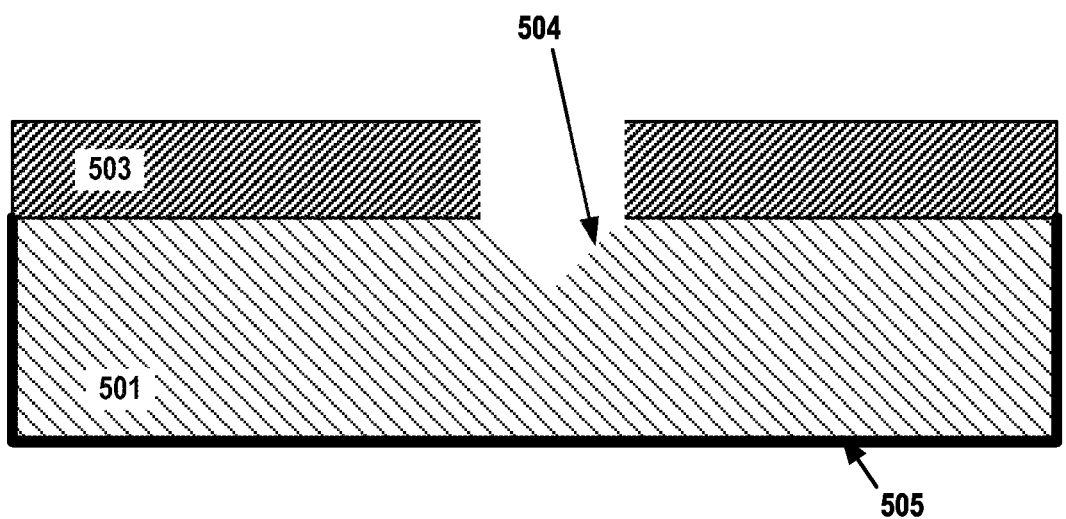
FIG. 12 is a cross-sectional diagram of an etched metal line structure including a hard mask layer and a via gouge in an embodiment of the invention after an etch step.

FIG. 12 is a cross-sectional diagram of an etched metal line structure including a hard mask layer and a via gouge in an embodiment of the invention after an etch step. In this embodiment, after the metal line 501 is formed over the substrate (not shown), a hard mask 503 is deposited. The hard mask is an insulator like SiO2, Si3N4 or SiC in some embodiments of the invention. In other embodiments, the hard mask 503 is a metal such as TiN, TaN or W. These materials can be deposited using convention processes, for example, a CVD or PVD process is used in embodiments of the invention. Other hard masks are known to the art and can be used in other embodiments of the invention. In this embodiment, an anisotropic etch using a physical bombardment, of Ar, Kr and/or Xe ions is used. Anisotropic etches are well known processes. This results in a via gouge 504 with a conical shape. As described above, in subsequent processing, the hard mask 503 is removed and the capping layer (not shown) is deposited over the structure including the via gouge.

Figure 13:
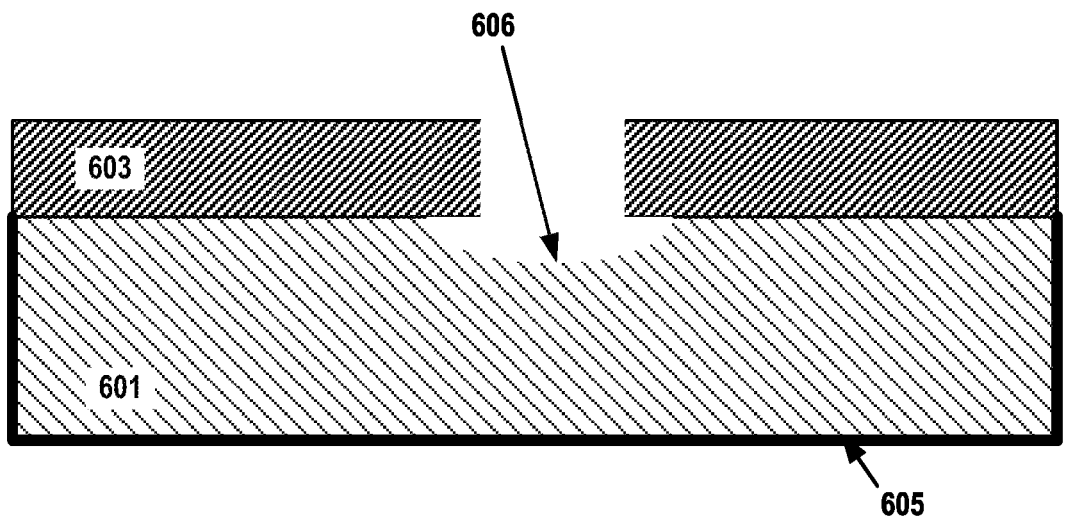
FIG. 13 is a cross-sectional diagram of an etched metal line structure including a hard mask layer and a via gouge in an embodiment of the invention after an etch step.

FIG. 13 is a cross-sectional diagram of an etched metal line structure including a hard mask layer and a via gouge in an embodiment of the invention after an etch step. In this embodiment, after the metal line 601 is formed over the substrate (not shown), a hard mask 603 is deposited. The hard mask is of a similar material as described above. In this embodiment, an isotopic etch such as a chemical wet etch results in a bowl-like via gouge 604.

The drawings mostly depict the bowl-shaped via variant in the various embodiments. However, the reader is reminded that either the bowl-shaped via gouge or the cone-shaped via gouge are present in the different embodiments according to the principles of the invention.

The resulting structures can be included within integrated circuit chips, which can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of features are illustrated in the drawings, those ordinarily skilled in the art would understand that many different types of features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A method for fabricating an interconnection for a device in an integrated circuit comprising:
   providing a substrate including a first metal line embedded in a first dielectric layer;
   etching a via gouge in the first metal line;
   depositing a second dielectric layer over the first metal line and the first dielectric layer;
   etching a first via recess through the second dielectric layer, the first via recess aligned to the via gouge; and
   depositing a second metal layer in the first via recess and the via gouge, forming a first via.

2. The method as recited in claim 1 further comprising;
   etching a metal line pattern recess through the second dielectric layer, the metal line pattern recess aligned to the via recess; and
   forming a barrier layer over the metal line pattern and via recesses prior to depositing the second metal layer in the metal line pattern and first via recesses and the via gouge;
   wherein a second metal line pattern is formed in the metal line pattern recess.

3. The method as recited in claim 2, wherein a first via mask is used for creating the via gouge and the via recess.

4. The method as recited in claim 2, further comprising:
   etching a second via recess through the second dielectric layer, the second via recess aligned to a planar portion of a metal line and a second portion of the metal line pattern recess is aligned to the second via recess; and wherein the barrier layer is formed over the second via recess prior to depositing the second metal layer in the second via recess, forming a second via, and wherein the first via is formed in a critical area and the second via is formed in a non-critical area of the device.

5. The method as recited in claim 1, wherein the via gouge has a conical shape.

6. The method as recited in claim 1, wherein the via gouge has a bowl-like shape.

7. The method as recited in claim 2, wherein the via gouge has a width dimension wider than a width dimension of the first via.

8. The method as recited in claim 7, further comprising:
depositing a capping layer over the first metal line and the first dielectric layer prior to depositing the second dielectric layer; and
wherein the barrier layer meets the capping layer along a top surface of the via gouge.

\* \* \* \* \*